United States Patent
Cheng et al.

(10) Patent No.: US 9,656,852 B2
(45) Date of Patent: May 23, 2017

(54) CMOS-MEMS DEVICE STRUCTURE, BONDING MESA STRUCTURE AND ASSOCIATED METHOD

(71) Applicant: TAIWAN SEMICONDUCTOR MANUFACTURING COMPANY LTD., Hsinchu (TW)

(72) Inventors: Chun-Wen Cheng, Hsinchu County (TW); Yi-Chuan Teng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/792,058

(22) Filed: Jul. 6, 2015

(65) Prior Publication Data

US 2017/0008757 A1    Jan. 12, 2017

(51) Int. Cl.
*B81B 3/00* (2006.01)
*B81C 1/00* (2006.01)

(52) U.S. Cl.
CPC .......... *B81B 3/001* (2013.01); *B81C 1/00976* (2013.01); *B81B 2207/012* (2013.01)

(58) Field of Classification Search
CPC ... B81B 7/007; B81B 3/0056; B81C 1/00238; B81C 1/0023
See application file for complete search history.

(56) References Cited

U.S. PATENT DOCUMENTS

2012/0313235 A1* 12/2012 Chu .................. B81B 3/0005
257/692

* cited by examiner

*Primary Examiner* — Thomas L Dickey
(74) *Attorney, Agent, or Firm* — WPAT, P.C., Intellectual Property Attorneys; Anthony King

(57) ABSTRACT

The present disclosure provides a CMOS-MEMS device structure. The CMOS-MEMS device structure includes a sensing substrate and a CMOS substrate. The sensing substrate includes a bonding mesa structure. The CMOS substrate includes a top dielectric layer. The sensing substrate and the CMOS substrate are bonded through the bonding mesa structure, and the bonding mesa structure defines a bonding gap between the CMOS substrate and the sensing substrate.

17 Claims, 10 Drawing Sheets

CMOS-MEMS DEVICE STRUCTURE, BONDING MESA STRUCTURE AND ASSOCIATED METHOD

BACKGROUND

In the MEMS and micro-electronic fields there is frequently a need for bonding wafers together for the purpose of encapsulating structures in vacuum cavities or in cavities with controlled atmosphere. Such structures may have to be operable during very long times, most often tens of years. It can also be desirable to provide electrical connection between wafers via the sealing.

It is of course absolutely necessary that the joints that holds/bonds the wafers together and that provides the actual sealing of said cavities will provide good enough sealing that will not deteriorate over time. Eutectic bonding is one of popular means for bonding, but eutectic bonding may cause large deviations. In addition, eutectic overflow is another issue need to be taken care of.

Another reliability problem commonly observed with MEMS devices is stiction, or the surface tension between approximate surfaces under miniature scale. Generally, stiction is the static friction that needs to be overcome in order to enable relative motion of stationary objects that are in contact with one another. When two surfaces with areas below the micrometer range come into close proximity, such as evidenced in MEMS devices, they may adhere together, thus limiting the reliability of the MEMS device. At this scale, the two main failure factors of MEMS devices are electrostatic or charge-induced stiction, and/or Van der Waals force-induced stiction. Such stiction issues present various problems previously addressed.

Therefore, a novel mechanism to mitigate aforementioned issues has become an urgent need in fields pertinent to semiconductor manufacturing industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
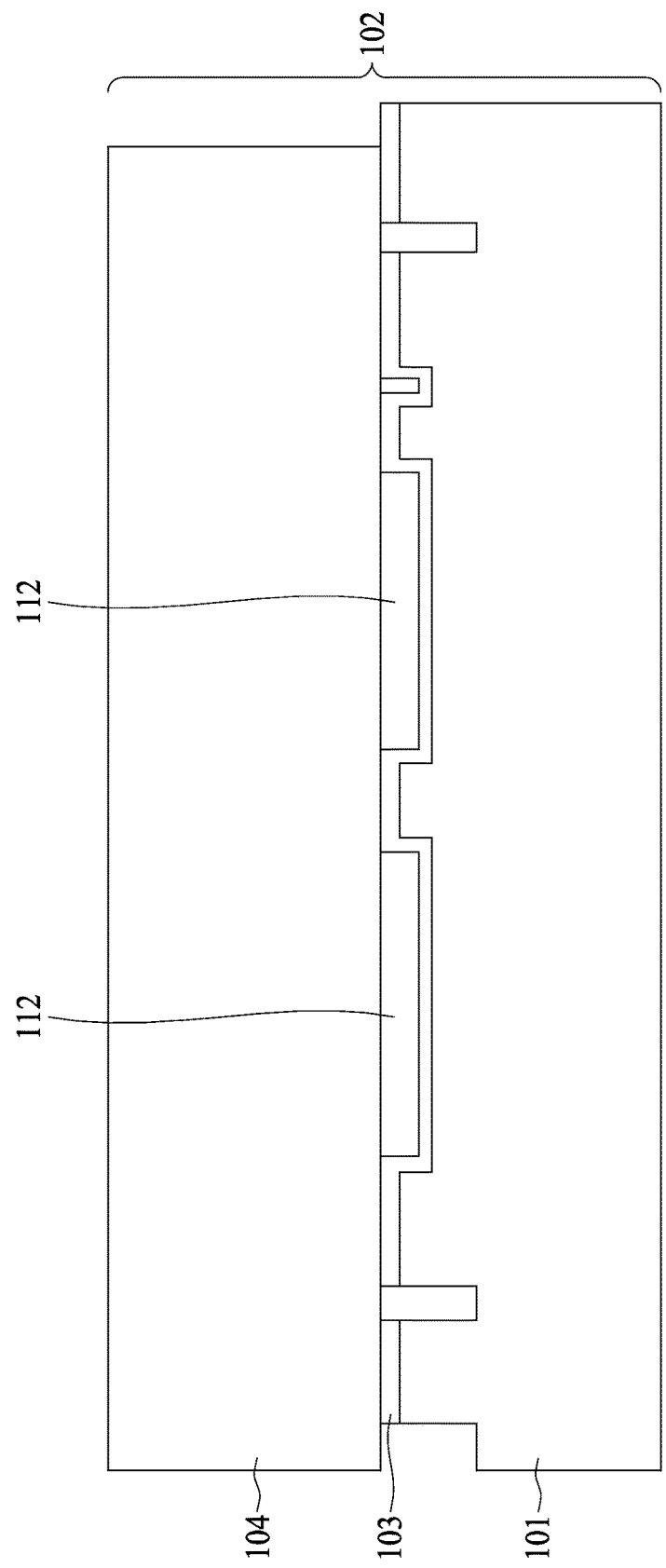
FIGS. 1-10 are a series of cross-sectional views illustrating processing steps to fabricate a CMOS-MEMS device structure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present invention relates generally to Micro-Electro-Mechanical Systems (MEMS) devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the described embodiments, MEMS refers to a class of structures or devices fabricated using semiconductor-like processes and exhibiting mechanical characteristics such as the ability to move or deform. MEMS often, but not always, interact with electrical signals. MEMS devices include, but are not limited to, gyroscopes, accelerometers, magnetometers, pressure sensors, and radio-frequency components. In some embodiments, a MEMs device structure may include a plurality of the aforesaid MEMs devices. Silicon wafers containing a MEMS device or a MEMS device structure are referred to as MEMS wafers.

In the described embodiments, MEMS device may refer to a semiconductor device implemented as a micro-electro-mechanical system. A MEMS device structure may refer to any feature associated with an assembly of a plurality of MEMS devices. An engineered silicon-on-insulator (ESOI)

wafer may refer to a SOI wafer with cavities beneath the silicon device layer or substrate. Cap or handle wafer typically refers to a thicker substrate used as a carrier for the thinner silicon sensing substrate in a silicon-on-insulator wafer. Cap or handle substrate and cap or handle wafer can be interchanged. In the described embodiments, a cavity may refer to an opening or recession in a substrate wafer and enclosure may refer to a fully enclosed space.

To describe the features of the invention in more detail, apparatus and fabrication methods to achieve a MEMS device with features including improved bonding gap uniformity and stiction and eutectic overflow prevention are disclosed.

FIGS. 1-10 are a series of cross-sectional views illustrating processing steps to fabricate a MEMS device assembly, or a MEMS device, according to an embodiment of the present disclosure. In FIG. 1, a sensing substrate 104 and a cap substrate 101 are fusion bonded together with a thin dielectric film 103 therebetween to form an ESOI substrate 102. Please note that in the exemplary embodiment of the present disclosure, the sensing substrate 104 and the cap substrate 101 are bonded together by fusion bonding at relatively high processing temperatures, which enables more complete removal of chemical species from the dielectric materials in the substrates prior to sealing cavities of the MEMS structures. Fusion bonding makes high temperature annealing on both sides wafers possible, which reduces outgassing of chemical species during the cavity formation process. The MEMS structures bonded by fusion bonding are mechanically stronger compared to metal bonding due to a higher bonding ratio. In addition, fusion bonding enables the formation of through substrate vias (TSVs) in the MEMS structures without degrading yield. However, the concept of the present disclosure is not limited thereto. One of ordinary skill in the art would recognize many variations, modifications, and alternatives. The concept of the present disclosure may be also applied to other types of MEMS device assembly in some embodiments.

The thin dielectric film 103 includes materials such as silicon oxide or other insulating layer. Along with a surface of the cap substrate 101, a plurality of cavities 112 of desired sizes are defined and patterned on through isotropic etching, for example, but this is not a limitation of the present disclosure. One of ordinary skill in the art would recognize many variations, modifications, and alternatives. The plurality of cavities 112 are utilized to accommodate an adjacent movable proof mass of a MEMS device to be fabricated. The size of each cavity 112 may be determined according to the movable proof mass and/or desired performance of the MEMS device. In some embodiments, each cavity 112 may be of different depth or dimension than the other cavities.

Figure 2:
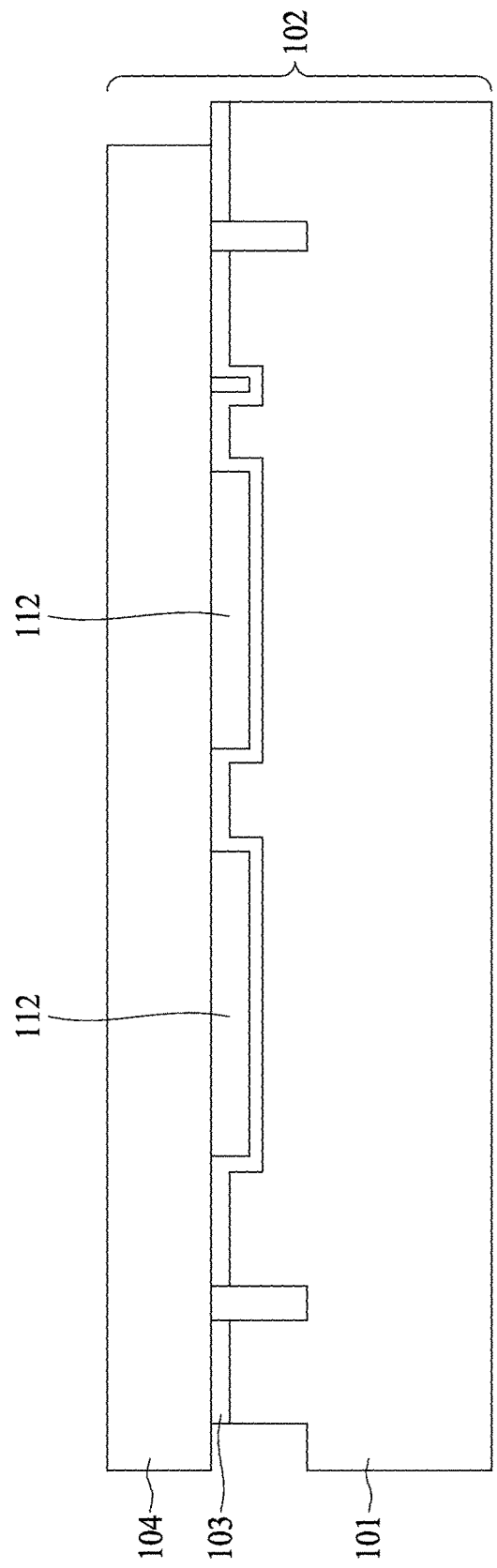

The sensing substrate 104 is then thinned using a grinding and/or other thinning process to achieve the desired thickness as illustrated in FIG. 2. Existing thinning techniques like Chemical Mechanical Planarization (CMP) and/or Reactive Ion Etching (RIE) can be used to achieve the desired thickness. Suitable grinding and polishing equipments may be used for the thinning process. One of ordinary skill in the art would recognize many variations, modifications, and alternatives. Precision control of the thinning process may be utilized in some embodiments since there is no structure that can be used as a stop layer to terminate the thinning process in the embodiment illustrated in FIG. 2. If not controlled precisely, the thinning may yield a product thinner or thicker than a desired sensing substrate, thus affecting the performance of the MEMS device subsequently fabricated. In some other embodiments, an etch stop layer is integrated into sensing substrate 104 in order to facilitate precision control of the thinning process. One of ordinary skill in the art would recognize many variations, modifications, and alternatives.

Figure 3:
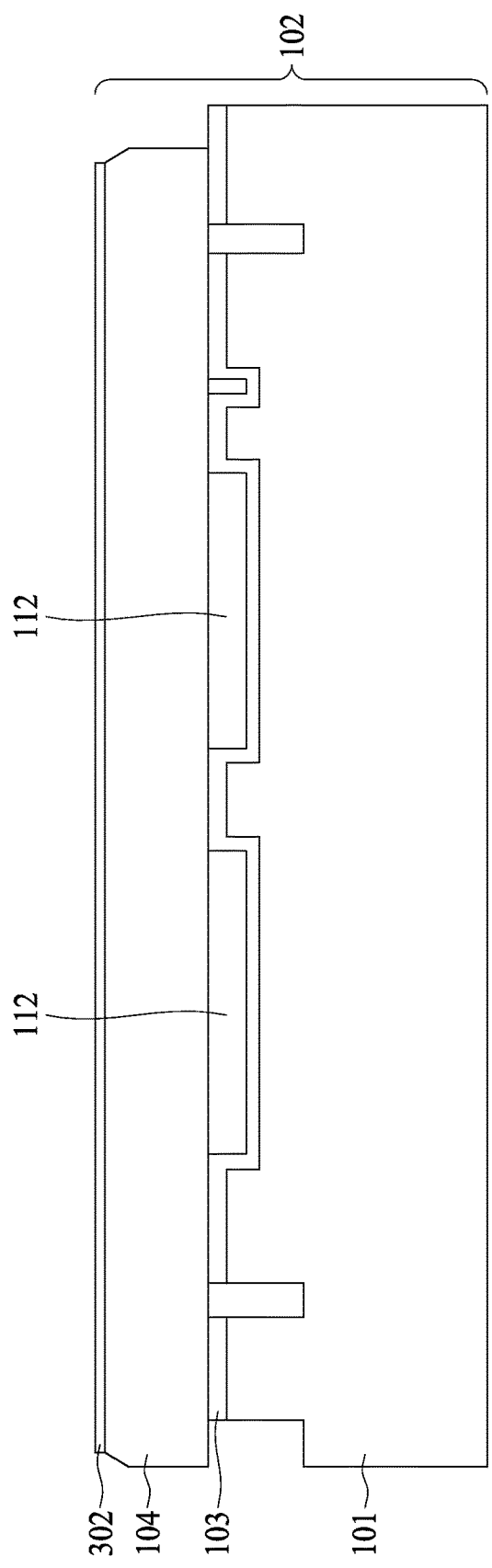
Figure 4:
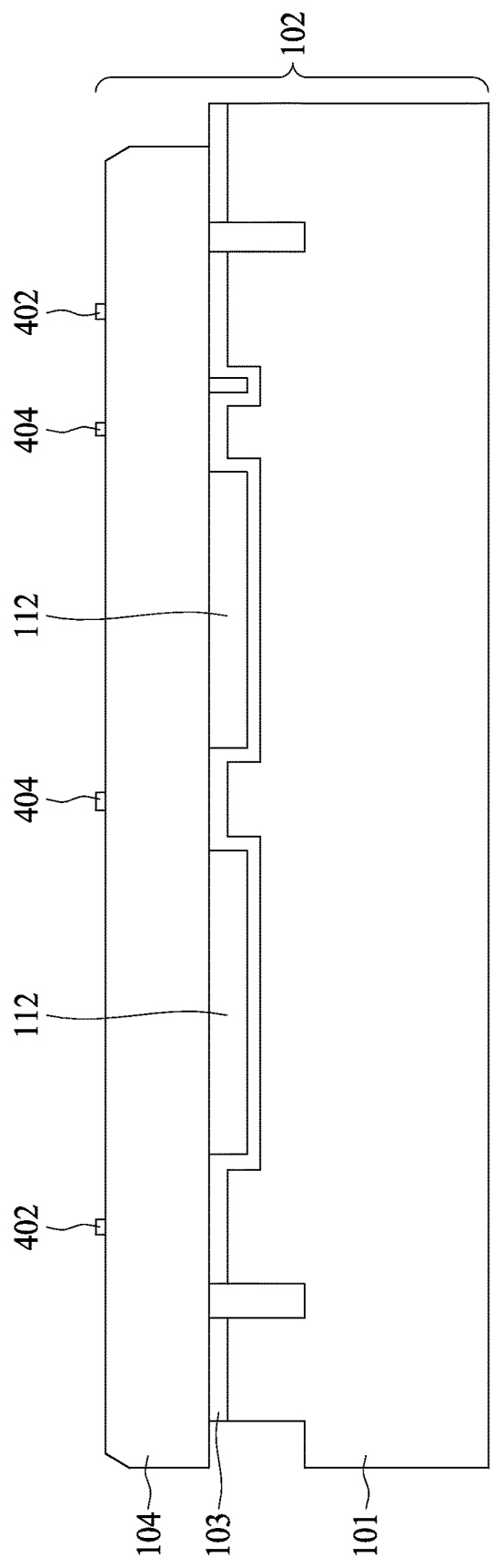

Referring to FIG. 3, a metal layer 302 is then deposited on the sensing substrate 104. In some embodiments, the metal layer 302 is deposited using electroplating, physical vapor deposition (PVD), or a Chemical Vapor Deposition (CVD) process. One of ordinary skill in the art would recognize many variations, modifications, and alternatives. The next step shown in FIG. 4 is to pattern and etch the metal layer 302 according to a structure of the MEMS device to be produced. As a consequence of the pattern and etch operation, a plurality of bonding regions 402 and 404 are formed for bonding in following steps, such as eutectic bonding being employed in the exemplary embodiment. However, this is not a limitation of the present disclosure. One of ordinary skill in the art would recognize many variations, modifications, and alternatives.

For purposes of clarity, a photolithography process in which a photoresist layer is deposited on the metal layer 302 and patterned to form an etch mask is not shown in this process flow. The dimensions of the etch mask may be tightly controlled during photolithography and the etch mask may be formed from any suitable material that is resistant to the etching process used to etch the metal layer. In some embodiments, an etch mask of Silicon Nitride ($Si_3N_4$) is utilized. In some other embodiments, a photoresist layer can serve as the etch mask. One of ordinary skill in the art would recognize many variations, modifications, and alternatives. Although a one dimensional cross section is illustrated in FIG. 4, it will evident to one of skill in the art that a two-dimensional pattern of the desired geometry is formed in the metal layer 302. In some embodiments, the bonding regions 402 and 404 may comprise germanium, aluminum, or copper. In other embodiments, other materials such as gold, indium, or other solders having good adhesion underlying layers and improved wetting capability may be used for the bonding regions.

Figure 5:
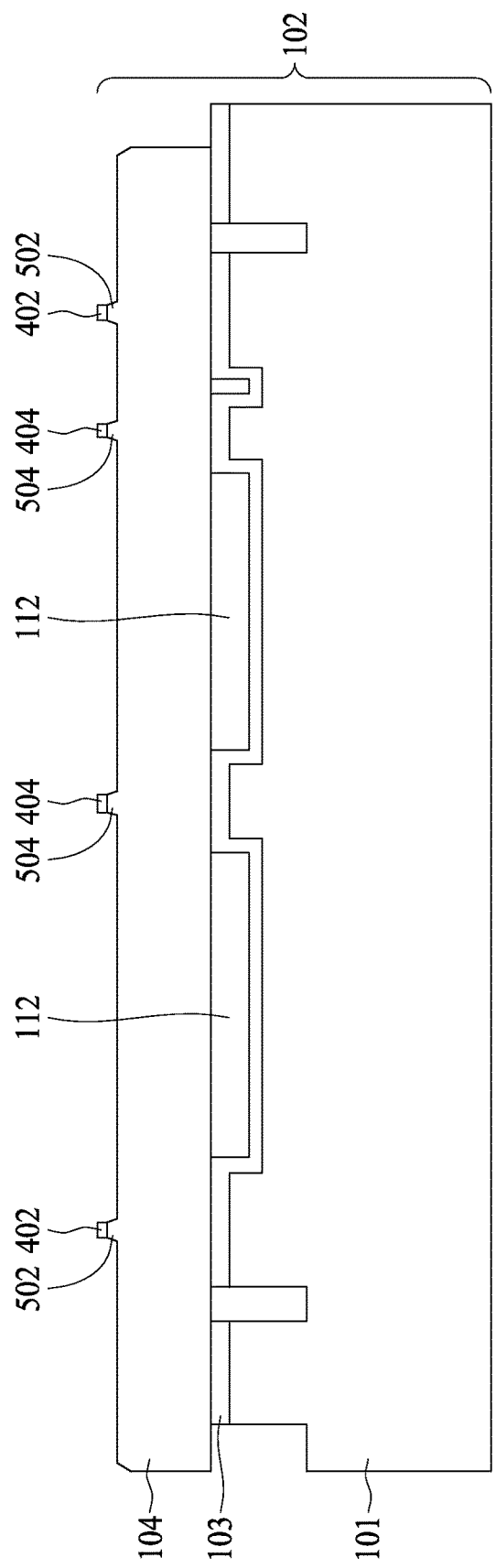

Thereafter, a first shallow cavity etch is performed selectively to the sensing substrate 104. During the first shallow cavity etch, shallow cavities are photo patterned and wet etched to a certain depth in the surface of the sensing substrate 104. From the view of exterior, a plurality of first step bonding mesas 502 and 504 are left on the surface of the sensing substrate 104 as can be seen in FIG. 5. To put it more specific, the plurality of first step bonding mesas 502 and 504 are located beneath the conductive bonding regions 402 and 404 to carry the conductive bonding regions 402 and 404 as a stack structure. In the exemplary embodiment, the width of the plurality of first step bonding mesas 502 and 504 are wider than the bonding regions 402 and 404. The side walls of the plurality of first step bonding mesas 502 and 504 can be tapered. However, the present disclosure is not limited thereto. In some embodiments, the width of the plurality of first step bonding mesas 502 and 504 is the same with the bonding regions 402 and 404, and the side walls of the plurality of first step bonding mesas 502 and 504 are vertical. One of ordinary skill in the art would recognize many variations, modifications, and alternatives. As will be discussed more fully below, the plurality of first step bonding mesas 502 and 504 together with followed second step bonding mesas serve to provide a uniform bonding gap between the sensing substrate 104 and a Complementary Metal-Oxide-Semiconductor (CMOS) substrate.

Figure 6:
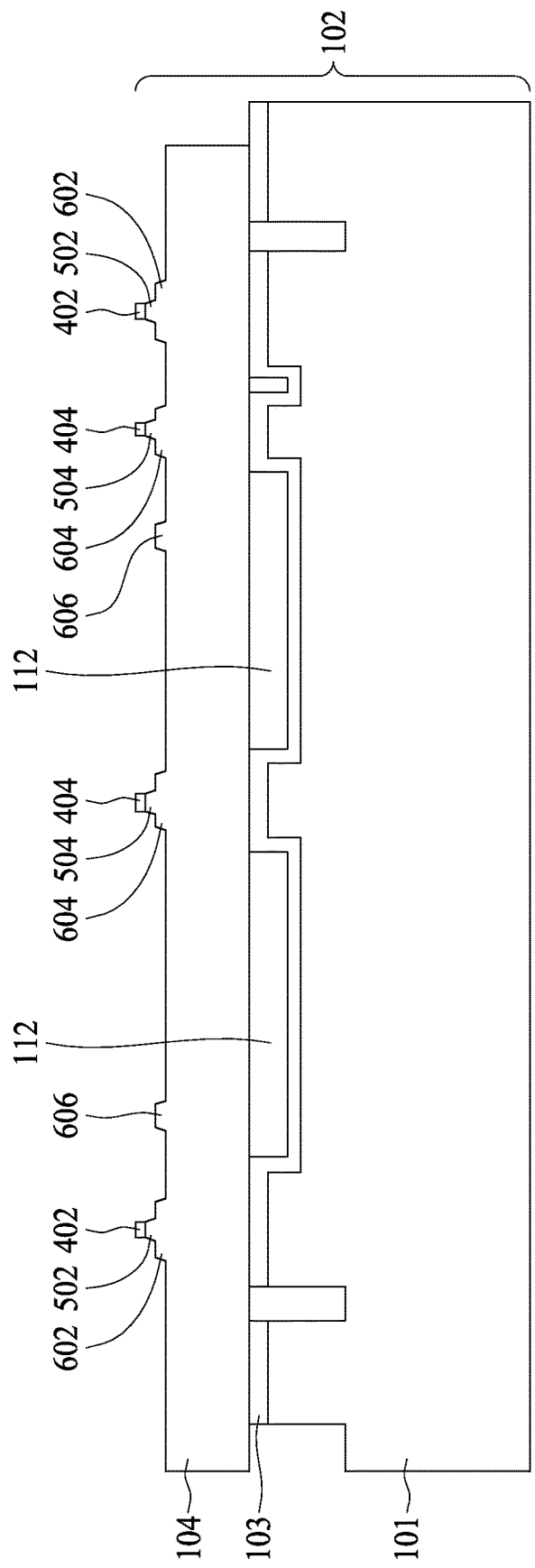

Thereafter, a step of second shallow cavity etch similar to the first shallow cavity etch is performed selective to the sensing substrate 104. Similar to the first shallow cavity etch, during the second shallow cavity etch, second shallow cavities are photo patterned and wet etched to a certain depth in the surface of the sensing substrate 104. From the view of exterior, a plurality of second step bonding mesas 602 and 604 and a plurality of anti-stiction bumps 606 are on the surface of the sensing substrate 104 as can be seen in FIG. 6. In some embodiments, the anti-stiction bumps 606 are formed concurrently within the same operation of forming the second step bonding mesas 602 and 604. To put it more specific, the plurality of second step bonding mesas 602 and 604 are located beneath the plurality of first step bonding mesas 502 and 504 and the conductive bonding regions 402 and 404 as a double stack structure. The plurality of anti-stiction bumps 606 are disposed on regions where the MEMS device to be formed for stiction prevention, as the details will be given later. In the exemplary embodiment, the width of the plurality of second step bonding mesas 602 and 604 are wider than the plurality of first step bonding mesas 502 and 504 and the bonding regions 402 and 404. The side walls of the plurality of second step bonding mesas 602 and 604 can be tapered or at a slope of a specific degree. However, the present disclosure is not limited thereto. In some embodiments, the side walls of the plurality of second step bonding mesas 602 and 604 are vertical. One of ordinary skill in the art would recognize many variations, modifications, and alternatives.

Figure 7:
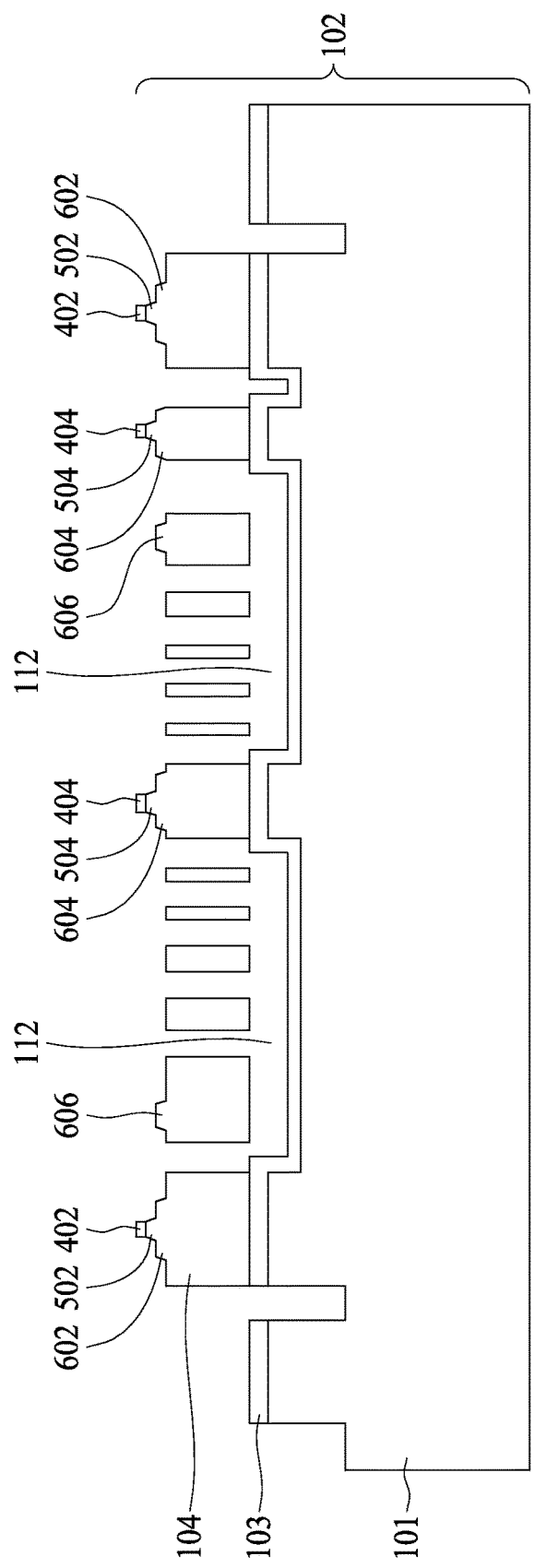

The sensing substrate 104 is then patterned and deep etched to form the sensing substrate as illustrated in FIG. 7. The sensing substrate includes a proof-mass, balanced or unbalanced, suspended by at least one spring or elastic device and free to move in at least one of the x-, y-, and z-directions, with at least one electrode embedded in the at least one spring or elastic device. The at least one spring or elastic device is attached to a support structure, which is attached to the sensing substrate 104. The proof-mass, support structure, and at least one electrode are fabricated in the same semiconductor layers as the drive/sense circuitry. In some embodiments, the at least one spring or elastic device and the support structure form a network of supports. The proof-mass, suspended by the network of supports, is free to move in any direction. The MEMS capacitively senses or produces movement of the proof-mass in any direction. In some embodiments, the direction can include a direction along at least one of the x-, y-, and z-directions.

In some embodiments, the patterning and etching techniques used to form the sensing substrate may vary depending on the type of the MEMS device. For example, the patterning and etching for a MEMS accelerometer is different from the patterning and etching used for a MEMS gyroscope. Existing etching techniques like anisotropic etching, RIE, or the like may be used. In some embodiments, the thickness of the sensing substrate 104 can vary as a function of position along the length of the sensing substrate, where the length is defined along a direction orthogonal to the thickness of the substrate. For example, the sensing substrate 104 may have a first thickness at one end, a second thickness in the center, and a third thickness at the other end.

Figure 8:
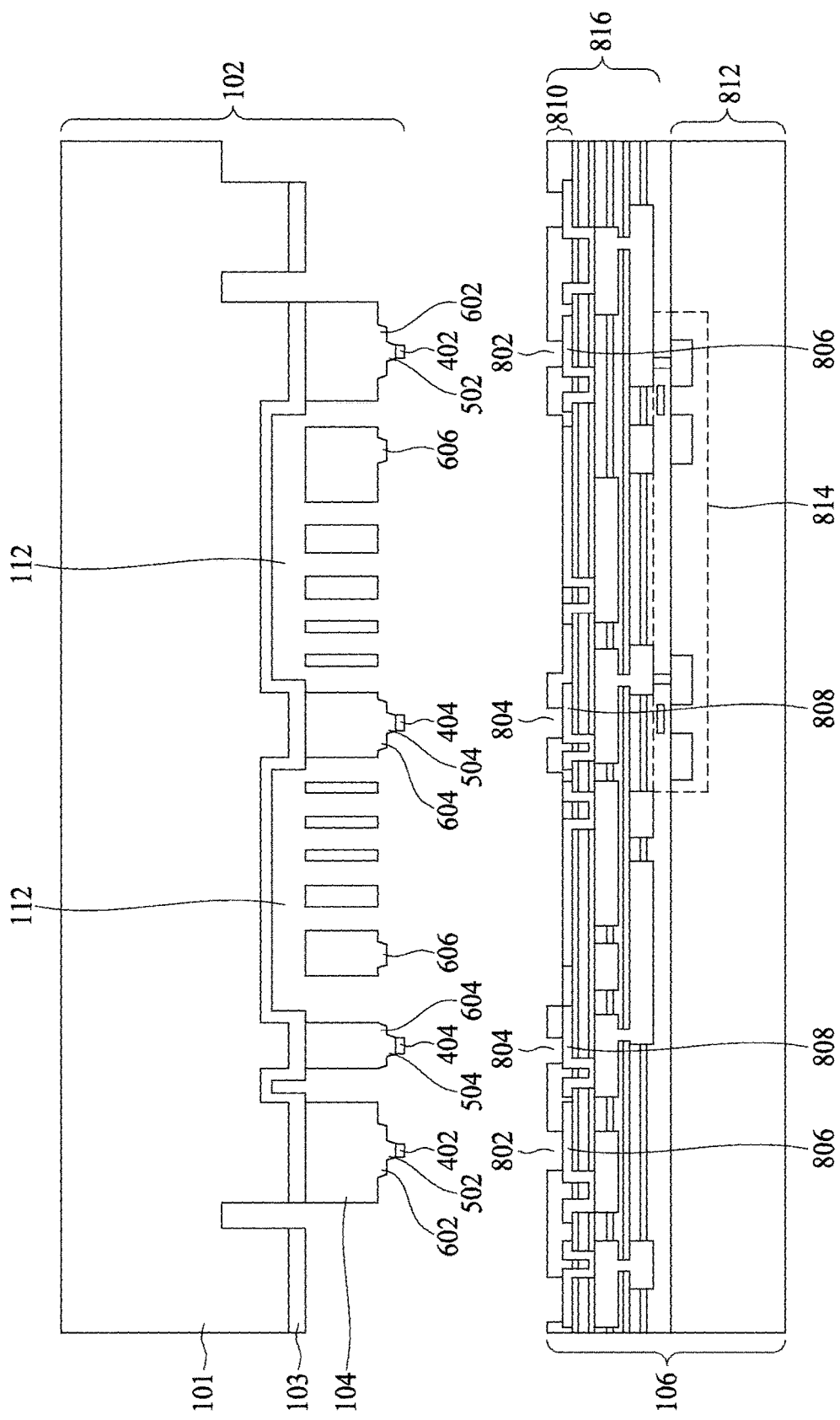

Next, as illustrated in FIG. 8, the ESOI substrate 102 and a CMOS wafer 106 are pre cleaned and then aligned prior to eutectic bonding. In the present disclosure, a CMOS wafer can be termed as a CMOS substrate. The CMOS wafer 106 may include a substrate 812. The substrate 812 may comprise a semiconductor material such as silicon, although other semiconductor materials may be used. A plurality of CMOS devices 814 (such as transistors) is formed at a surface of substrate 812. Furthermore, an interconnect structure 816 is formed to electrically couple to the CMOS devices 814. The interconnect structure 816 may include dielectric layers, which further include low-k dielectric layers, non-low-k dielectric layers such as passivation layers, and the like. Metal lines and vias, which may be formed of copper, aluminum, and combinations thereof, are formed in the dielectric layers. A top dielectric layer 810 of the interconnect structure 816 is patterned, and a plurality of openings, including openings 802 and 804 corresponding to the bonding regions 402 and 404, are formed in the top dielectric layer 810. As a result, the bonding areas 806 and 808 are exposed. The dielectric layer 810 has a different melting characteristic compared to a bonding metal of a plurality of bonding areas 806 and 808 of the CMOS wafer 106.

Figure 9:
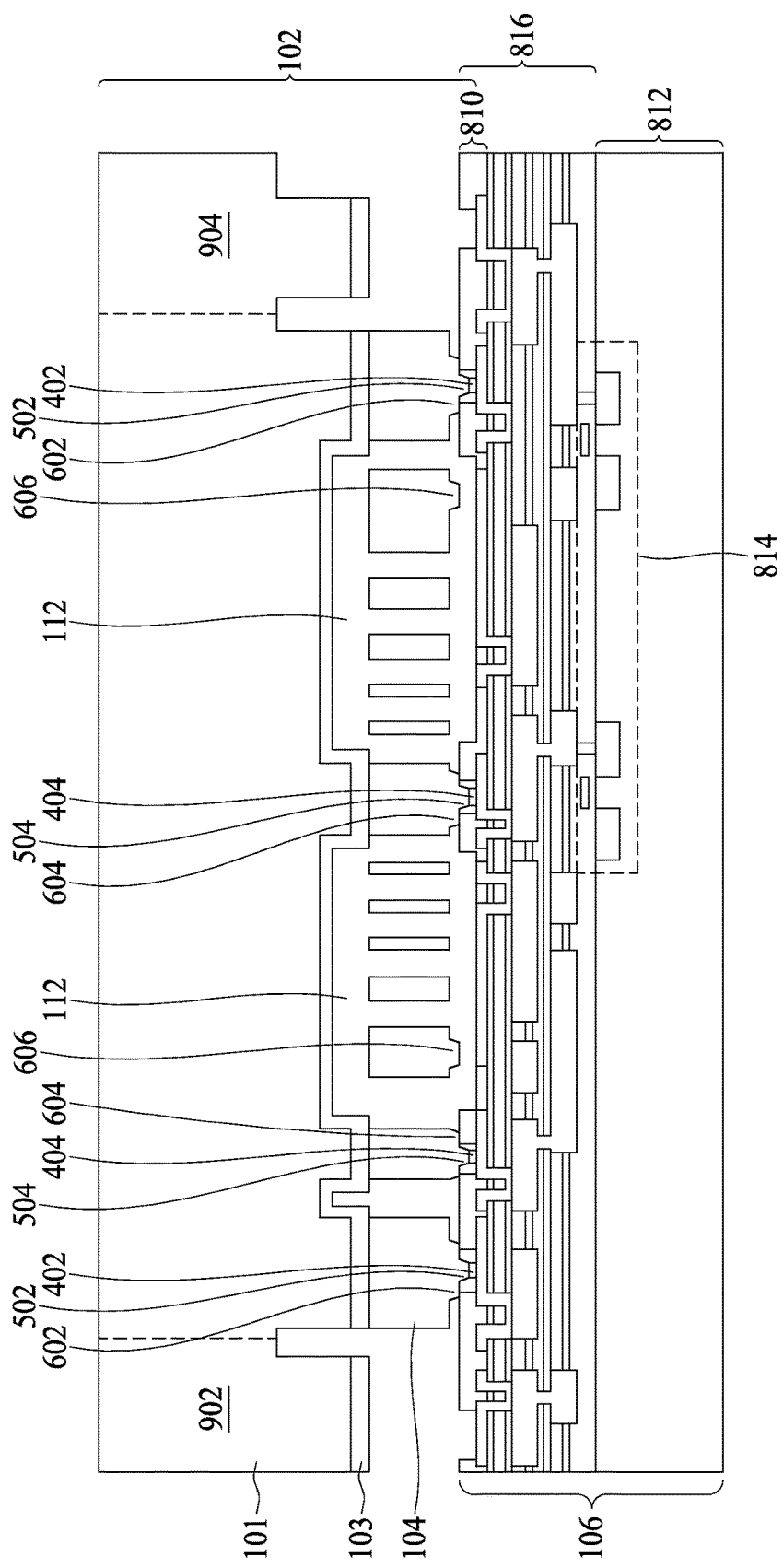

Thereafter, the ESOI substrate 102 is bonded to a CMOS wafer 106 as depicted in FIG. 9. In order to create the bond between the ESOI substrate 102 and the CMOS wafer 106, the bonding areas 806 and 808 of the CMOS wafer 106 is brought in contact with the bonding regions 402 and 404 of the ESOI substrate 102. The bonding interface is then subjected to pressure and heat in order to reflow the conductive material comprised in the bonding regions 402 and 404 and the corresponding bonding areas 806 and 808 of the CMOS wafer 106. Reflow of the conductive material results in a fused bond structure that provides an ohmic contact between the ESOI substrate 102 and the CMOS wafer 106. The bond between the ESOI substrate 102 and the CMOS wafer 106 can be an Al/Ge eutectic bond. This eliminates the need for providing a separate electrical path for the signals between the sensing substrate and the CMOS wafer 106. Please note that this is not a limitation of the present disclosure. In some embodiments, the eutectic bond may be comprised of other type of metallic materials.

Eutectic reactions are a triple point in the phase diagram where solid alloys mixtures transform directly to a liquid phase. Upon cooling, a microstructure is formed, which is both strong and hermetic. Eutectic metal compositions have several benefits as sealing materials, including the ability to accurately deposit and define the metals in desired patterns, the tolerance to surface deviations, roughness and particulates, plus metals' inherent hermeticity and conductivity. Hermeticity, the degree of air tightness for a vessel or package, is useful for MEMS packages because the mechanical and electrical functionality of the device within the package typically relies on critical environmental control. Change in the atmosphere inside the package can bring about a shift in performance or even a total failure of the device.

The uniformity of the bonding gap between the sensing substrate 104 and the CMOS wafer 106 may be affected by the flatness of the substrate surface and the bond force used to bond the wafers in existing process. In this exemplary embodiment, the MEMS device assembly may use the plurality of second step bonding mesas 602 and 604 to control the uniformity of the bonding gap regardless of the flatness of the substrate surface and the bonding force. Furthermore, the second step bonding mesas 602 and 604 may operate as a mechanical stop that prevents the eutectic bonding material from spreading to undesired regions.

To put it more specific, when the bonding regions 402 and 404 first contact with the bonding areas 806 and 808 in the openings 802 and 804, the second step bonding mesas 602 and 604 is not directly in touch with the patterned dielectric layer 810. When the temperature reaches the eutectic melting temperature, the bonding regions 402 and 404 and the bonding metal of the bonding areas 806 and 808 are melted and gradually fused and mixed together. The height of the molten materials of the bonding regions 402 and 404 and the bonding metal of the bonding areas 806 and 808 is then reduced and thus the second step bonding mesas 602 and 604 is finally contact with the patterned dielectric layer 810. The ESOI substrate 102 therefore stops further approaching the CMOS wafer 106, and the bonding gap between the ESOI substrate 102 and the CMOS wafer 106 can be effectively controlled.

Except for the first effect of the present disclosure, i.e., providing a uniform bonding gap, a second and a third effects are also provided. The second effect is molten metallic materials of the bonding regions 402 and 404 and the bonding areas 806 and 808 are confined in the enclosed spaces defined by the openings 802, 804 and the second step bonding mesas 602 and 604 once the second step bonding mesas 602 and 604 is directly and closely in touch with the patterned dielectric layer 810. The enclosed spaces defined by the openings 802, 804 and the second step bonding mesas 602 and 604, operate as solid boundaries, are advantageous to restrict the liquid eutectic from lateral overflow and being in contact with any other conductive materials over the interconnect structure 816 that should not be in contact with. In short, the present disclosure provides eutectic overflow prevention structure to prevent unwanted device short issues.

In view of the above, a preferred aspect of this disclosure is to provide bonding sites for eutectic bonding at wafer level to overcome bonding problems encountered. Surface features are defined to serve as reflow boundaries and/or barriers during the eutectic bonding process to limit electrical shorting between neighboring electrodes. The ability of the boundaries and barriers to accommodate and restrict the flow of reflowed bonding material is advantageous because it allows sufficient bonding material to be deposited on a wafer with a significant amount of curvature in order to ensure that sufficient bonding material will be present where interface gaps will be the largest between a pair of wafers, while reducing or preventing the excess bonding material at other locations from overflowing the bonding site and shorting electrodes or other conductive structures in the vicinity of the bonding site during reflow. The result is much better bonding strength and higher process yields for MEMS fabrication.

The third effect of the present disclosure is to mitigate the stiction issue. In stiction prevention design, an anti-stiction bump can be utilized to prevent stiction when a sensing substrate inadvertently reaches the surface of an underlying substrate, say a CMOS substrate, for example. There are two main failure factors regarding stiction in MEMS devices, however, one factor is charge-induced stiction, and the factor other is Van der Waals force-induced stiction.

One way of reducing the stiction problems involves minimizing a contact area between the sensing substrate and the underlying substrate by utilizing an anti-stiction bump design. As illustrated in FIG. 9, a plurality of anti-stiction bumps 606 protrude from the sensing substrate 104 in order to limit the contact area between a proof mass of the sensing substrate 104 and a surface of the underlying substrate. In some embodiments, the anti-stiction bumps 606 and the second step bonding mesas 602 and 604 are formed simultaneously, hence it is easy to implement and integrate to existing process schemes without introducing too much cost. The anti-stiction bumps 606 significantly reduce the contact area of the MEMS device and mitigate the in-process and in-use stiction. In other embodiments, several anti-stiction structure similar to the anti-stiction bumps 606 can be formed on the surface of the underlying CMOS wafer 106 (not shown in FIG. 9). The aforesaid anti-stiction structure may possess a similar height and width as those of the anti-stiction bumps 606. The anti-stiction structure may be composed of oxide or metal depending on the surface regions of the CMOS wafer corresponding to the location of a desired proof mass which, in general cases, would be designed to associate with an anti-stiction feature.

Please note that the two step height mesa eutectic bonding may be applied to a contact or a bond ring (or a sealing ring) adjoining the ESOI substrate 102 and the CMOS wafer 106. The dimension of the second step bonding mesas 602 and 604 and the first step bonding mesas 502 and 504 depends on design specifications such as a height of the sensing gap between the proof mass and the CMOS wafer 106, and the quantity of the metal composing the bonding regions 402 and 404. The geometry of the two step height mesa structure is not limited to the embodiments mentioned above. As long as a structure can provide a function substantial the same with the present disclosure through the same or similar concept, the structure also falls into the scope of the present disclosure.

Figure 10:
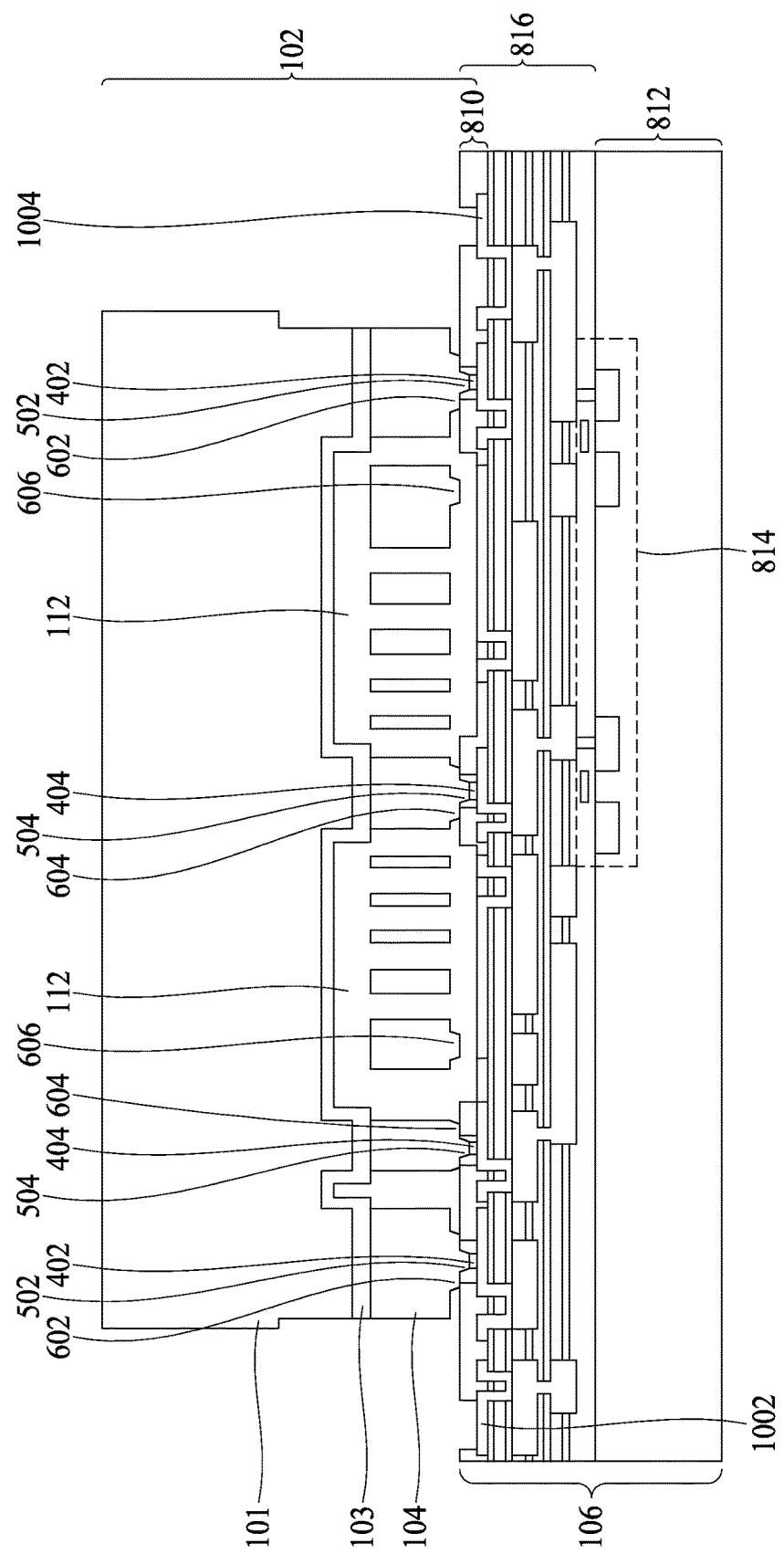

In a subsequent step, a pad opening step is performed. Portions 902 and 904 of the cap substrate 101 are removed, for example, in an etching step or a grind-open step. The resulting structure is shown in FIG. 10. Bond pads 1002 and 1004 in CMOS wafer 106 are hence no longer overlapped by the ESOI substrate 102, and hence external bondings may be performed on the bond pads 1002 and 1004. The bond pads 1002 and 1004 may be used for wire bonding, for example. In some embodiments, the etching is anisotropic, and hence edges of the cap substrate 101 of FIG. 10 are substantially straight. Alternatively, the portions 902 and 904 can be removed by a grind-open step, wherein a grinding wheel or blade is used to erase the portions 902 and 904. The formation of the MEMS-device-comprising package is thus finished.

The present disclosure provides a method for producing a MEMS device assembly having mechanical stops and anti-stiction bumps. Since the mechanical stops and bumps are formed in a substrate of the layered wafer structure at the same time prior to wafer bonding, no additional process steps are required to create the anti-stiction bumps thus yielding a simplified, low cost solution to forming anti-stiction features.

Some embodiments of the present disclosure provide a CMOS-micro-electromechanical systems (MEMS) device structure, including a sensing substrate and a CMOS substrate. The sensing substrate includes a bonding mesa structure, and the CMOS substrate includes a top dielectric layer; wherein the sensing substrate and the CMOS substrate are bonded through the bonding mesa structure, and the bonding mesa structure defines a bonding gap between the CMOS substrate and the sensing substrate.

In some embodiments of the present disclosure, the CMOS-MEMS device structure further including a cap substrate covering the sensing substrate.

In some embodiments of the present disclosure, the sensing substrate and the CMOS substrate are bonded through eutectic metal.

In some embodiments of the present disclosure, the bonding mesa structure includes a first step bonding mesa and a second step bonding mesa, the second step bonding mesa being wider than the first step bonding mesa.

In some embodiments of the present disclosure, the eutectic metal includes Ge and Al.

In some embodiments of the present disclosure, the second step bonding mesa and the top dielectric layer define an enclosed space within which eutectic metal is disposed.

In some embodiments of the present disclosure, the enclosed space further accommodates the first step bonding mesa.

In some embodiments of the present disclosure, the sensing substrate includes a movable element configured to have a bump structure not in contact with the top dielectric layer.

Some embodiments of the present disclosure provide a bonding mesa structure for bonding a first semiconductor structure and a second semiconductor structure. The bonding mesa structure includes a two step bonding mesa and an opening. The two step bonding mesa is disposed on the first semiconductor structure, wherein a bonding metal is connected to the two step bonding mesa. The opening is disposed in a surface of the second semiconductor structure, wherein a metal layer in the second semiconductor structure is exposed through the opening. A portion of the two step bonding mesa is inserted into the opening to bring the bonding metal in contact with the metal layer, and another portion of the two step bonding mesa is in contact with the surface of the second semiconductor structure.

In some embodiments of the present disclosure, the two step bonding mesa includes a first step bonding mesa and a second step bonding mesa, the second step bonding mesa being in contact with the first semiconductor structure, the first step bonding mesa being in contact with the second step bonding mesa.

In some embodiments of the present disclosure, the second step bonding mesa is wider than the first step bonding mesa.

In some embodiments of the present disclosure, the bonding metal is in contact with the first step bonding mesa.

In some embodiments of the present disclosure, a height of the first step bonding mesa is less than a depth of the opening.

In some embodiments of the present disclosure, the two step bonding mesa and the opening define an enclosed space within which the bonding metal is disposed.

Some embodiments of the present disclosure provide a method of fabricating a CMOS-MEMS device structure. The method includes: providing a first semiconductor substrate; depositing a bonding metal layer on the first semiconductor substrate; etching a portion of the bonding metal layer to form a bonding metal; etching the first semiconductor substrate to form a two step bonding mesa; etching the first semiconductor substrate to form a sensing substrate; providing a second semiconductor substrate including an opening on a surface of the second semiconductor substrate, wherein a metal layer in the second semiconductor substrate is exposed through the opening; and bonding the first semiconductor substrate to the second semiconductor substrate through the two step bonding mesa; wherein the bonding mesa structure defines a bonding gap between the first semiconductor substrate and the second semiconductor substrate.

In some embodiments of the present disclosure, further includes providing a third semiconductor substrate to cover the sensing substrate.

In some embodiments of the present disclosure, the etching the first semiconductor substrate to form the two step bonding mesa includes: etching the first semiconductor substrate to form a first step bonding mesa; and etching the first semiconductor substrate to form a second step bonding mesa; wherein the second step bonding mesa is wider than the first step bonding mesa and the opening.

In some embodiments of the present disclosure, when bonded, the second step bonding mesa and the opening define an enclosed space within which the bonding metal is disposed.

In some embodiments of the present disclosure, further includes etching the first semiconductor substrate to form a bump structure laterally distanced from the two step bonding mesa when forming the two step bonding mesa.

In some embodiments of the present disclosure, the etching the first semiconductor substrate to form a sensing substrate includes forming a movable element configured to have the bump structure thereon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A CMOS-MEMS device structure, comprising:
  a sensing substrate, comprising a bonding mesa structure, wherein the bonding mesa structure includes a first step bonding mesa and a second step bonding mesa, the second step bonding mesa being wider than the first step bonding mesa; and
  a CMOS substrate, comprising a top dielectric layer;
  wherein the sensing substrate and the CMOS substrate are bonded through the bonding mesa structure, and the bonding mesa structure defines a bonding gap between the CMOS substrate and the sensing substrate, and the second step bonding mesa is in contact with the top dielectric layer.

2. The CMOS-MEMS device structure of claim 1, further comprising a cap substrate covering the sensing substrate.

3. The CMOS-MEMS device structure of claim 1, wherein the sensing substrate and the CMOS substrate are bonded through eutectic metal.

4. The CMOS-MEMS device structure of claim 3, wherein the eutectic metal comprises Ge and Al.

5. The CMOS-MEMS device structure of claim 1, wherein the second step bonding mesa and the top dielectric layer define an enclosed space within which eutectic metal is disposed.

6. The CMOS-MEMS device structure of claim 5, wherein the enclosed space further accommodates the first step bonding mesa.

7. The CMOS-MEMS device structure of claim 1, wherein the sensing substrate comprises a movable element configured to have a bump structure not in contact with the top dielectric layer.

8. A bonding mesa structure for bonding a first semiconductor structure and a second semiconductor structure, comprising:
  a two step bonding mesa disposed on the first semiconductor structure, wherein a bonding metal is connected to the two step bonding mesa, wherein the two step bonding mesa includes a first step bonding mesa and a second step bonding mesa, the second step bonding mesa being in contact with the first semiconductor structure, the first step bonding mesa being in contact with the second step bonding mesa; and an opening disposed in a surface of the second semiconductor structure, wherein a metal layer in the second semiconductor structure is exposed through the opening;

wherein the first step bonding mesa is inserted into the opening to bring the bonding metal in contact with the metal layer, and the second step bonding mesa is in contact with the surface of the second semiconductor structure.

9. The bonding mesa structure of claim 8, wherein the second step bonding mesa is wider than the first step bonding mesa.

10. The bonding mesa structure of claim 9, wherein the bonding metal is in contact with the first step bonding mesa.

11. The bonding mesa structure of claim 10, wherein a height of the first step bonding mesa is less than a depth of the opening.

12. The bonding mesa structure of claim 10, wherein the two step bonding mesa and the opening define an enclosed space within which the bonding metal is disposed.

13. A method of fabricating a CMOS-MEMS device structure, comprising:

providing a first semiconductor substrate;

depositing a bonding metal layer on the first semiconductor substrate;

etching a portion of the bonding metal layer to form a bonding metal;

etching the first semiconductor substrate to form a two step bonding mesa, including:

etching the first semiconductor substrate to form a first step bonding mesa; and etching the first semiconductor substrate to form a second step bonding mesa;

etching the first semiconductor substrate to form a sensing substrate;

providing a second semiconductor substrate including an opening on a surface of the second semiconductor substrate, wherein a metal layer in the second semiconductor substrate is exposed through the opening; and bonding the first semiconductor substrate to the second semiconductor substrate through the two step bonding mesa, and contacting the second step bonding mesa with the surface of the second semiconductor substrate;

wherein the two step bonding mesa defines a bonding gap between the first semiconductor substrate and the second semiconductor substrate, and the second step bonding mesa is wider than the first step bonding mesa and the opening.

14. The method of claim 13, further comprising providing a third semiconductor substrate to cover the sensing substrate.

15. The method of claim 13, wherein when bonded, the second step bonding mesa and the opening define an enclosed space within which the bonding metal is disposed.

16. The method of claim 13, further comprising etching the first semiconductor substrate to form a bump structure laterally distanced from the two step bonding mesa when forming the two step bonding mesa.

17. The method of claim 16 wherein the etching the first semiconductor substrate to form a sensing substrate comprises forming a movable element configured to have the bump structure thereon.

* * * * *